United States Patent [19]
Miyake et al.

[11] Patent Number: 5,511,719
[45] Date of Patent: Apr. 30, 1996

[54] PROCESS OF JOINING METAL MEMBERS

[75] Inventors: Toshihiro Miyake, Inuyama; Katuya Bando, Anjo; Toshiaki Yagura, Nukata; Koji Kondo, Toyohashi, all of Japan

[73] Assignee: Nippondenso Co., Ltd., Kariya, Japan

[21] Appl. No.: 251,921

[22] Filed: Jun. 1, 1994

[30] Foreign Application Priority Data

Jun. 1, 1993 [JP] Japan .................................... 5-158024

[51] Int. Cl.$^6$ .................................................. B23K 1/20
[52] U.S. Cl. ...................... 228/106; 228/180.22; 228/205
[58] Field of Search ................................ 228/106, 111.5, 228/180.22, 205

[56] References Cited

U.S. PATENT DOCUMENTS

| 3,608,809 | 9/1971 | Cushman | 228/5.5 |
|---|---|---|---|
| 3,669,333 | 6/1972 | Coucoulas | 228/5.5 |
| 4,589,584 | 5/1986 | Christiansen et al. | 228/111.5 |
| 4,893,742 | 1/1990 | Bullock | 228/111.5 |
| 5,031,308 | 7/1991 | Yamashita et al. | 228/175 X |

FOREIGN PATENT DOCUMENTS

| 50-103451 | 8/1975 | Japan . |
|---|---|---|
| 51-20589 | 2/1976 | Japan . |
| 51-122773 | 10/1976 | Japan . |
| 53-83077 | 7/1978 | Japan . |
| 62-172676 | 7/1987 | Japan . |
| 212930 | 1/1990 | Japan . |
| 2-256297 | 2/1990 | Japan . |
| 4186697 | 7/1992 | Japan . |

*Primary Examiner*—Kenneth J. Ramsey
*Attorney, Agent, or Firm*—Cushman, Darby & Cushman

[57] ABSTRACT

A process of joining metal members, comprising the steps of: providing a first group of a plurality of metal members, each member having a solder bead formed thereon; providing a second group of a plurality of metal members, each member having a solder bead formed thereon; abutting the first group of metal members against the second group of metal members by direct contact between the solder beads; applying an ultrasonic vibration through the metal members to the solder beads in contact; and subsequently heating the beads to cause the solder beads to be bonded together.

5 Claims, 4 Drawing Sheets

PROCESS OF JOINING METAL MEMBERS

BACKGROUND OF THE INVENTION

1. Field of the Invention

The present invention relates to a process of joining metal members, such as connection terminals between circuit boards, typically between flexible and rigid circuit boards.

The term "circuit board" as referred to herein means a structure composed of an insulating base board and an electric circuit formed on the base board. The term "flexible circuit board" means a circuit board having a flexible base board.

2. Description of the Related Art

Processes of joining connection terminals between circuit boards are disclosed in Japanese Unexamined Patent Publication (Kokai) No. 51-20589, Japanese Unexamined Patent Publication (Kokai) No. 51-122773, Japanese Unexamined Patent Publication (Kokai) No. 53-83077, and Japanese Unexamined Patent Publication (Kokai) No. 4-186697.

Japanese Unexamined Patent Publication (Kokai) No. 51-20589 disclosed a process of joining connection terminals between circuit boards by interposing an electroconductive resilient material between the electrodes of two circuit boards and holding these circuit boards so that the electroconductive resilient piece is kept compressed between the electrodes. This process cannot provide a reliable joint at low or high temperatures, because the electroconductive resilient piece is a metal contact, an electroconductive rubber piece, or an electroconductive coil spring.

Japanese Unexamined Patent Publication (Kokai) No. 51-22773 disclosed a process, in which connection terminals of a flexible circuit board are joined to connection terminals of an electronic component by a cushion kept compressed. This process also has the same problem as that encountered in the above-mentioned process, i.e., it cannot provide a reliable joint at low or high temperatures.

Japanese Unexamined Patent Publication (Kokai) No. 53-83077 disclosed a process of joining connection terminals of a flexible circuit board to connection terminals of a rigid circuit board by thermocompression bonding, in which an excessive amount of molten solder is allowed to flow away through the holes opened at sites corresponding to connection terminals of the flexible circuit board. This process involves the use of a flux which cannot completely be removed from the joint because of its structure and a flux residue reduces the reliability of the joint.

Japanese Unexamined Patent Publication (Kokai) No. 4-186697 disclosed a process, in which a thermoplastic resin is interposed between a connection terminal of a flexible printed circuit board and a connection terminal of another circuit board, and an ultrasonic vibration is then used to effect solid phase bonding. This process has a problem that plural bonding points form an uneven surface which is unfavorable for providing a uniform bonding.

There is also known a process of joining connection terminals by forming a solder bead thereon and applying ultrasonic vibration to suppress generation of an oxide film on the solder bead, so as not to remove an oxide film. This process is disclosed in Japanese Unexamined Patent Publication (Kokai) No. 62-172676, in which a solder bead is provided only on one counterpart of the pair of connection terminals to be joined together and the other counterpart is not provided with a solder bead.

When the solder bead of one connection terminal is abutted against the other connection terminal having no solder bead and ultrasonic vibration is then applied to the abutted assembly, the ultrasonic vibration is only effective to remove an oxide film from the solder bead of the former connection terminal but is not effective to remove an oxide film from the latter connection terminal, because the solder bead material is softer than the connection terminal material.

Therefore, a flux is necessary to remove oxide films both from the solder bead (on the former connection terminal) and from the latter connection terminal.

Japanese Unexamined Patent Publication (Kokai) No. 2-12930 disclosed another process, in which a solder material is merely placed between the connection terminals to be joined together. In this process, the solder material is abutted against the connection terminal, so that an ultrasonic vibration cannot remove oxide films from both the solder material and the connection terminal, and therefore, a flux is necessary to remove the oxide films.

SUMMARY OF THE INVENTION

The object of the present invention is to provide a process of joining metal members such as connection terminals of flexible and rigid circuit boards, to form a reliable joint.

To achieve the object according to the present invention, there is provided a process of joining metal members, comprising the steps of:

providing a first group of a plurality of metal members, each member having a solder bead formed thereon;

providing a second group of a plurality of metal members, each member having a solder bead formed thereon;

abutting the first group of metal members against the second group of metal members by direct contact between the solder beads; and applying an ultrasonic vibration through the metal members to the solder beads in contact to cause the solder beads to be bonded together.

The process may further comprise the step of heating the solder beads during, and/or after, the application of an ultrasonic vibration.

The process may further comprise the step of simultaneously heating and pressing the solder beads during, and/or after, the application of an ultrasonic vibration.

The application of an ultrasonic vibration may be carried out with the solder beads being kept melted by heating.

Typically, the metal members are connection terminals of a circuit board.

Preferably, the application of an ultrasonic vibration is carried out under a pressure of 100 kg/mm$^2$ or more.

There is also provided a process of joining a first group of metal members forming part of a circuit pattern of a first circuit board to a second group of metal members forming part of a circuit pattern of a second circuit board, the process comprising the steps of:

abutting the first group of metal members against the second group of metal members; and applying an ultrasonic vibration to the metal members of the first group and the second group in a zone in which the metal members are abutted, through a buffer material which deforms to have an uneven surface which is closely engageable in a male-to-female shape relationship with any unevenness occurring on the metal members in the abutting zone, to cause the metal members of the first group to be bonded to the metal members of the second group in the abutting zone.

This process may further comprise the step of:

forming, prior to the application of an ultrasonic vibration, a solder bead on each of the metal members in a zone in which the metal members are to be abutted.

The process may further comprise the step of heating the solder beads during, and/or after, the application of an ultrasonic vibration.

The process may further comprise the step of simultaneously heating and pressing the solder beads during, and/or after, the application of an ultrasonic vibration.

Preferably, the application of an ultrasonic vibration is carried out with the solder beads being kept melted by heating.

According to the present invention, metal members, typically connection terminals of circuit boards, are abutted together, then subjected to an ultrasonic vibration followed by heating and pressing, and thereby melted to be joined together.

When a solder bead is formed on the metal members in advance, the ultrasonic vibration effectively removes any oxide film generated on the solder bead.

When an ultrasonic vibration is applied to the metal members via a buffer material which deforms to have an uneven surface which is closely engageable in a male-to-female shape relationship with any unevenness occurring on the metal members in the abutting zone, the plural metal members are subjected to a uniform ultrasonic vibration in spite of the unevenness.

In the present invention, the step of forming a solder bead on a metal member such as a connection terminal naturally requires that the surface of the connection terminal has no oxide films, or any oxide film is removed from the surface before forming the solder bead thereon. The solder bead is formed on the metal member by printing, plating, or other method using no flux. A pair of counterpart metal members to be joined are thus provided with solder beads, which are then abutted against each other and subjected to an ultrasonic vibration to remove oxide films on the solder beads, so that the metal members are joined together without using a flux.

The present invention may be advantageously applied to joining metal members, such as connection terminals but is not limited thereto.

DESCRIPTION OF THE PREFERRED EMBODIMENTS

Example 1

A preferred embodiment of the present invention will be described in detail with reference to the attached drawings.

Figure 1:
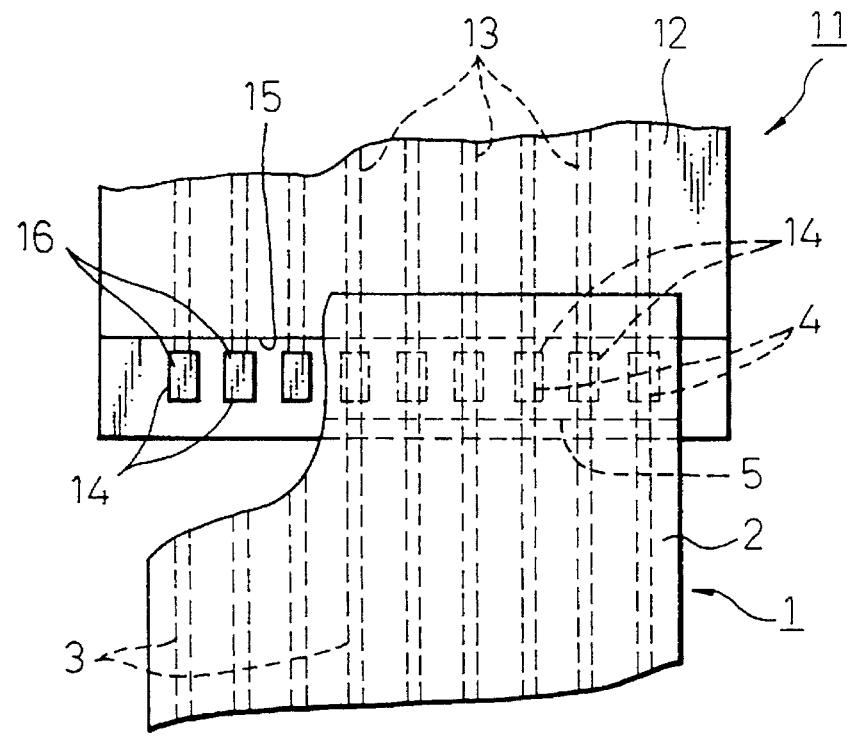
FIG. 1 shows flexible and rigid circuit boards having respective connection terminals placed in position for joining therebetween, in a partially broken plan view.
Figure 2:
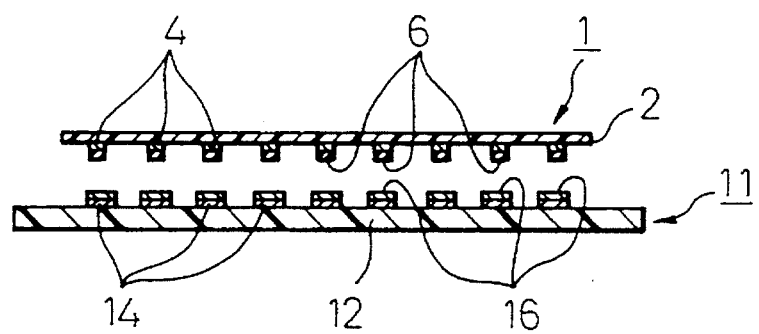
FIG. 2 is a sectional view along the line II—II of FIG. 1.

FIG. 1 shows flexible and rigid circuit boards having respective connection terminals placed in position for being joined, in a partially broken plan view and FIG. 2 is a sectional view along the line II—II of FIG. 1. A flexible circuit board 1 has a circuit pattern 3 which is made of a copper foil on a polyimide film 2 and covered with a resist layer 5 except for connection terminals 4 providing sites for joining. The connection terminals 4 have a solder coating 6 plated thereon.

A rigid circuit board 11, to which the flexible circuit board 1 is connected, has a circuit pattern 13 which is made of a copper foil on a glass/epoxy insulating board 12 and is covered with a resist layer 15 except for connection terminals 14 providing sites for joining. The connection terminals 14 have a solder coating 16 plated thereon.

The flexible circuit board 1 and the rigid circuit board 11 are overlapped so that the terminals 4 of the circuit pattern 3 of the former face the terminals 14 of the circuit pattern 13 of the latter and that the solder coating 6 of the connection terminals 4 are abutted against the solder coating 16 of the connection terminals 14.

Figure 3:
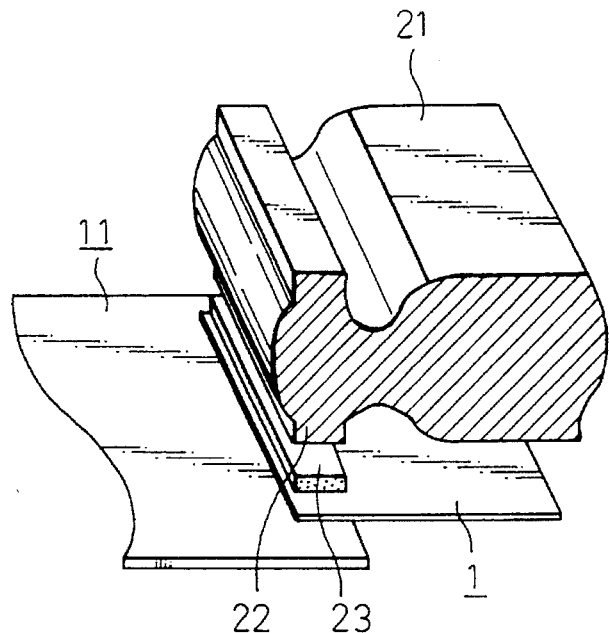
FIG. 3 shows an ultrasonic horn to apply an ultrasonic vibration to abutted flexible and rigid circuit boards having connection terminals to be joined according to the present invention, in a perspective view.

As shown in FIG. 3, an ultrasonic horn 21 is placed on the flexible circuit board 1 with a buffer material 23 interposed between the tip 22 of the ultrasonic horn 21 and the flexible circuit board 1. A 15 kHz ultrasonic vibration is then applied through the ultrasonic horn 21 to the flexible circuit board 1 for 4 seconds while the former is pressed against the latter at a pressure of about 135 kg/cm$^2$.

The buffer material 23 may be made from a piece of metal foil or a laminate of metal foils. The buffer material 23 is pressed by the tip 22 of the ultrasonic horn 21 against the rear surface of the flexible circuit board 1 in the zone in which the connection terminals 4 of the flexible circuit board and the connection terminals 14 of the rigid circuit board 14 are abutted. The buffer material 23, when thus pressed, is deformed to have an uneven surface which is closely engageable in a male-to-female shape relationship with the uneven rear surface of the flexible circuit board 1.

A metal mesh or a metal wool may be used instead of a metal foil.

A ultrasonic vibration, applied through the ultrasonic horn 1, is evenly transferred to the respective connection terminals 4 and 14 through the buffer material 23 to remove oxide films on the solder coatings 6 and 16 which are directly abutted and joined together. Thereafter, the ultrasonic horn 1 is moved away.

Figure 4:
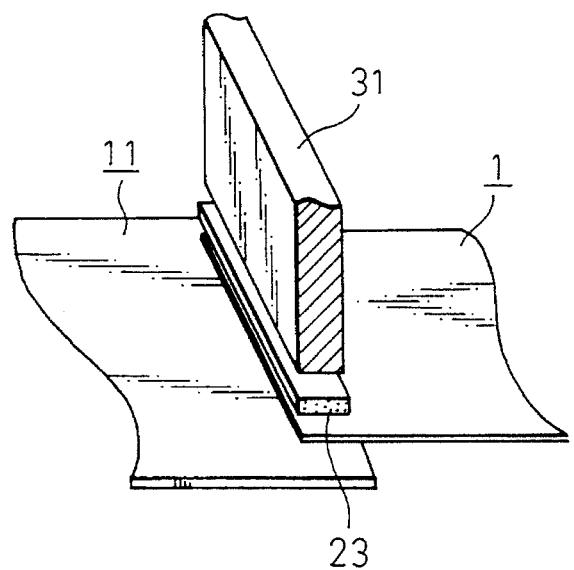
FIG. 4 shows a heater bar to heat and press connection terminals to be joined according to the present invention, in a perspective view.

Referring to FIG. 4, a heater bar 31 heated at 450° C. is then pressed against the flexible circuit board 1 via the buffer material 23 for 10 seconds to press and heat the abutting zone. This causes the solder coatings 6 and 16 to fuse, thereby joining or bonding the connection terminals 4 and 14 together. The inclusion of the buffer material 23 facilitates uniform bonding over plural joints.

The buffer material 23 used in the step of pressing and heating may be a silicone rubber sheet or the like.

The ultrasonic vibration frequency need not be the above 15 kHz but may be a higher frequency, for example, 20 kHz.

Example 2

This Example clarifies the advantage of the joint between connection terminals obtained by Example 1 by comparison with those obtained by other processes.

Figure 5:
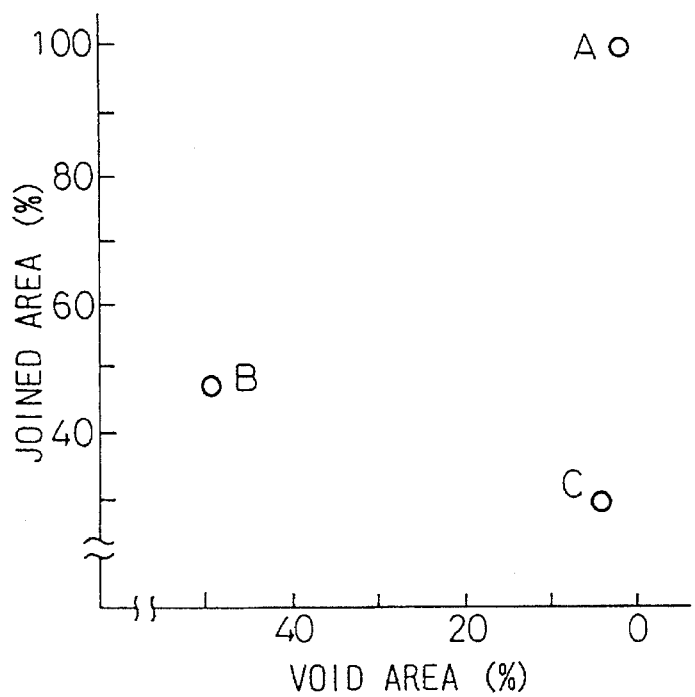
FIG. 5 is a graph showing the relationship between the percentage of the area of joined lands based on the area of all lands and the percentage of the area occupied by voids in the joined lands.

In FIG. 5, Joint A was obtained by the process described in Example 1 according to the present invention, Joint B is a comparative sample obtained by pressing while applying an ultrasonic vibration without using a flux, and Joint C is another comparative sample obtained by only heating without using a flux. Comparison was made among these samples with respect to the void percentage and the joined percentage.

The process conditions were the same as those used in Example 1.

It can be seen from FIG. 5 that Joint C has a large percentage of the void area, and in turn, a small percentage of the joined area, because an oxide film on the solder coating was not completely removed before the solder was melted to bond the connection terminals. Joint B has a small percentage of the void area because the applied ultrasonic vibration completely removed the oxide film on the solder coating, but has a small percentage of the joined percentage because the solder was not completely melted.

Both Joints B and C have a low entire cross-section strength because of a low value of the joined percentage.

In contrast, Joint A according to the present invention advantageously has a small percentage of the void area and a large percentage of the joined area, and therefore, has a high entire cross-section strength.

Example 3

The process according to the present invention was carried out under the same conditions as those used in Example 1 to form Joint A, except that the ultrasonic vibration was applied for different times. Another process was carried out by only applying an ultrasonic vibration at a frequency of about 20 kHz under a pressure of 180 kg/cm² to provide Joint D. The thus-obtained joints were compared in terms of the joint strength as summarized in FIG. 6.

Figure 6:
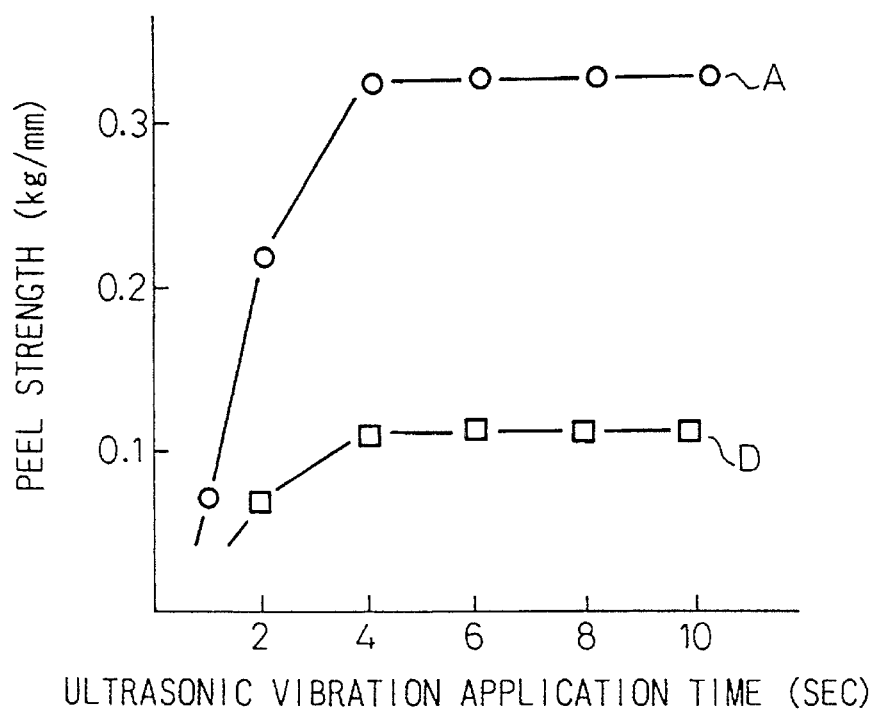
FIG. 6 is a graph showing the relationship between the peel strength (bond strength) and the ultrasonic vibration application time.

As can be seen from FIG. 6, the ultrasonic vibration provides an improved joint strength (i.e., both Joints A and D), but a sufficiently high strength is obtained only when the solder is melted by heating during application of the ultrasonic vibration (i.e., Joint A only).

It is also noted that the ultrasonic vibration is preferably applied for a time interval of not less than 4 seconds. This is also true under different frequencies of the ultrasonic vibration.

Example 4

A study was made to clarify the relationship between the percentage of the joined area and the pressure applied during the application of the ultrasonic vibration. A ultrasonic vibration was applied at 15 kHz for about 4 seconds under different pressures. The results are summarized in FIG. 7.

Figure 7:
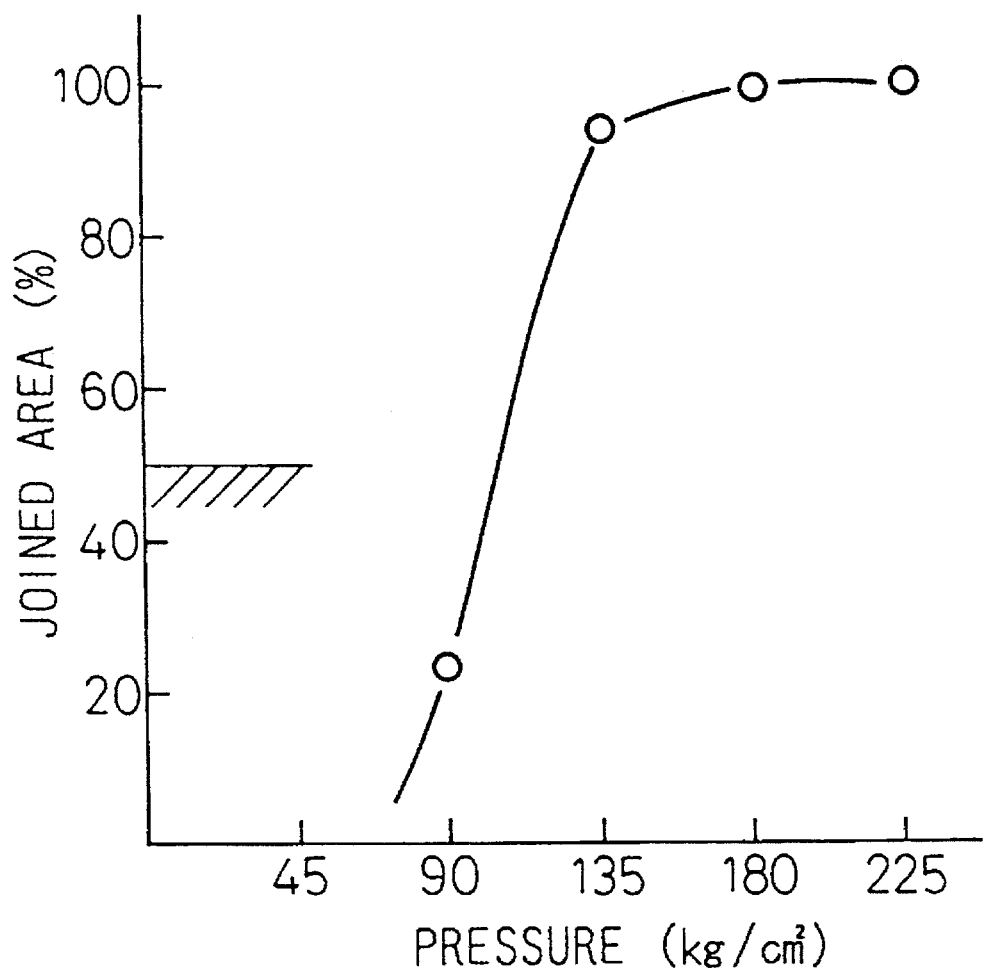
FIG. 7 is a graph showing the relationship between the percentage of the area of joined lands based on the area of all lands and the pressure applied during application of an ultrasonic vibration.

It can be seen from FIG. 7 that the pressure should be 100 kg/cm² or more, preferably 130 kg/cm² or more, to provide a percentage of joined area greater than 50%, which is the maximum value conventionally achieved by using no flux.

It is naturally recognized that the pressure must be sufficiently small so as not to damage the connection terminals.

This is also true for the application time and frequency of the ultrasonic vibration.

Although Examples 1 to 4 treat joining connection terminals of circuit boards, the present invention is not limited thereto but is advantageously applied to joining metal members by using solder.

The solder 6 or 16 to coat the connection terminals 4 and 14 is not limited to an Sn-Pb solder but can be an In-based solder, a Bi-based solder or the like, in accordance with the necessary heating temperature provided by the heater bar 31.

The present invention also includes a process in which solder is not used, but oxide films on the connection terminals 4 and 14 are removed by an applied ultrasonic vibration, and the connection terminals 4 and the connection terminals 14 are directly abutted against each other and bonded together by heating under pressure.

In an embodiment of the present invention, the buffer material 23 may be omitted.

The flexible circuit board may be a multiple lead having plural conductor lines molded in a common insulating belt.

The connection terminals of a circuit board may have the conducting portion exposed on one side or both sides of the circuit board.

The same advantageous results were obtained by using an ultrasonic vibration frequency of 40 kHz, instead of 15 or 20 kHz used in the above-recited examples.

Generally, an ultrasonic vibration frequency ranging from about 10 kHz to about 60 kHz may be used in the process according to the present invention.

As described hereinabove, the present invention provides a process of advantageously joining metal members such as connection terminals between circuit boards to form a reliable joint by not using flux, because the metal members such as connection terminals, or the solder coatings formed thereon, are directly abutted against each other, then subjected to an ultrasonic vibration to remove oxide films therefrom, and subjected to simultaneously heating and pressing to cause fusion thereof to form a joint therebetween.

The joint strength can be more uniform over all joints, when the ultrasonic vibration is applied more uniformly to the metal members in the abutting zone by using a buffer material which deforms to have an uneven surface which is closely engageable in a male-to-female shape relationship with any unevenness occurring on the metal members in the abutting zone.

We claim:

1. A process of joining metal members, comprising the steps of:

providing a first group of a plurality of metal members, each metal member having a solder bead formed thereon;

providing a second group of a plurality of metal members, each metal member of said second group having a solder bead formed thereon;

abutting said first group of metal members against said second group of metal members by direct contact between said solder beads;

applying ultrasonic vibration through said solder beads of said first and second groups of metal members;

terminating said application of ultrasonic vibration; and thereafter, heating and thereby fusing said solder beads to join said first and second groups of metal members.

2. A process according to claim 1, wherein said application of an ultrasonic vibration is carried out under a pressure of 100 kg/mm² or more.

3. A process of joining a first group of metal members forming part of a circuit pattern of a first, generally flexible circuit board to a second group of metal members forming part of a circuit pattern of a second, generally rigid circuit board, the process comprising the steps of:

abutting said first group of metal members against said second group of metal members;

applying a buffer material to a surface of said first circuit board;

applying ultrasonic vibration through said buffer material to said metal members of said first group and said second group in a zone in which said metal members are abutted;

terminating said application of ultrasonic vibration; and thereafter, heating and thereby fusing said metal members to join said first and second groups of metal members.

4. A process according to claim 3, wherein said application of an ultrasonic vibration is carried out under a pressure to 100 kg/mm$^2$ or more.

5. A process according to claim 3, wherein during said application of ultrasonic vibration, said buffer material is pressed and deformed causing said surface of said first circuit board to deform, said pressed buffer material conforming closely with said deformed surface of said first circuit board so as to compensate for any unevenness occurring on said metal members in said zone, thereby ensuring uniform fusing of said metal members.

* * * * *